United States Patent
Liu

(10) Patent No.: US 11,181,554 B2
(45) Date of Patent: Nov. 23, 2021

(54) CURRENT DETECTION APPARATUS

(71) Applicants: Kabushiki Kaisha Toshiba, Tokyo (JP); Toshiba Electronic Devices & Storage Corporation, Tokyo (JP)

(72) Inventor: Jia Liu, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 142 days.

(21) Appl. No.: 16/573,072

(22) Filed: Sep. 17, 2019

(65) Prior Publication Data

US 2020/0174043 A1 Jun. 4, 2020

(30) Foreign Application Priority Data

Nov. 30, 2018 (JP) .............................. JP2018-225746

(51) Int. Cl.
*G01R 15/14* (2006.01)
*G01R 15/20* (2006.01)
*G01R 15/18* (2006.01)

(52) U.S. Cl.
CPC ......... *G01R 15/148* (2013.01); *G01R 15/202* (2013.01); *G01R 15/207* (2013.01); *G01R 15/188* (2013.01)

(58) Field of Classification Search
CPC ...... G01R 15/00; G01R 15/12; G01R 15/148; G01R 15/20; G01R 15/202; G01R 15/207; G01R 15/181; G01R 15/188; G01R 19/0092
See application file for complete search history.

(56) References Cited

U.S. PATENT DOCUMENTS

| 6,683,448 | B1 * | 1/2004 | Ohtsuka | ................ | H01L 43/065 |
| | | | | | 324/117 H |
| 2003/0155905 | A1 | 8/2003 | Hauenstein | | |
| 2010/0211347 | A1 * | 8/2010 | Friedrich | ........... | G01R 33/0035 |
| | | | | | 702/117 |

FOREIGN PATENT DOCUMENTS

| JP | H05-10979 A | 1/1993 |
| JP | H09-318673 A | 12/1997 |
| JP | 2004-518976 A | 6/2004 |
| JP | 2009-168790 A | 7/2009 |

* cited by examiner

*Primary Examiner* — Son T Le
(74) *Attorney, Agent, or Firm* — Allen & Overy, LLP

(57) ABSTRACT

A current detection apparatus of an embodiment includes a coil pattern, a magnetic field detection element and a shielding layer. The coil pattern is configured with an arc-shaped planar coil and straight line portions parallel to each other extending from an end portion of the arc-shaped planar coil. The magnetic field detection element is arranged away from the coil pattern in a direction orthogonal to a plane of the planar coil and disposed to receive a magnetic field in a first direction generated by the coil pattern. The shielding layer is provided between the coil pattern and the magnetic field detection element and is provided with a slit portion.

6 Claims, 6 Drawing Sheets

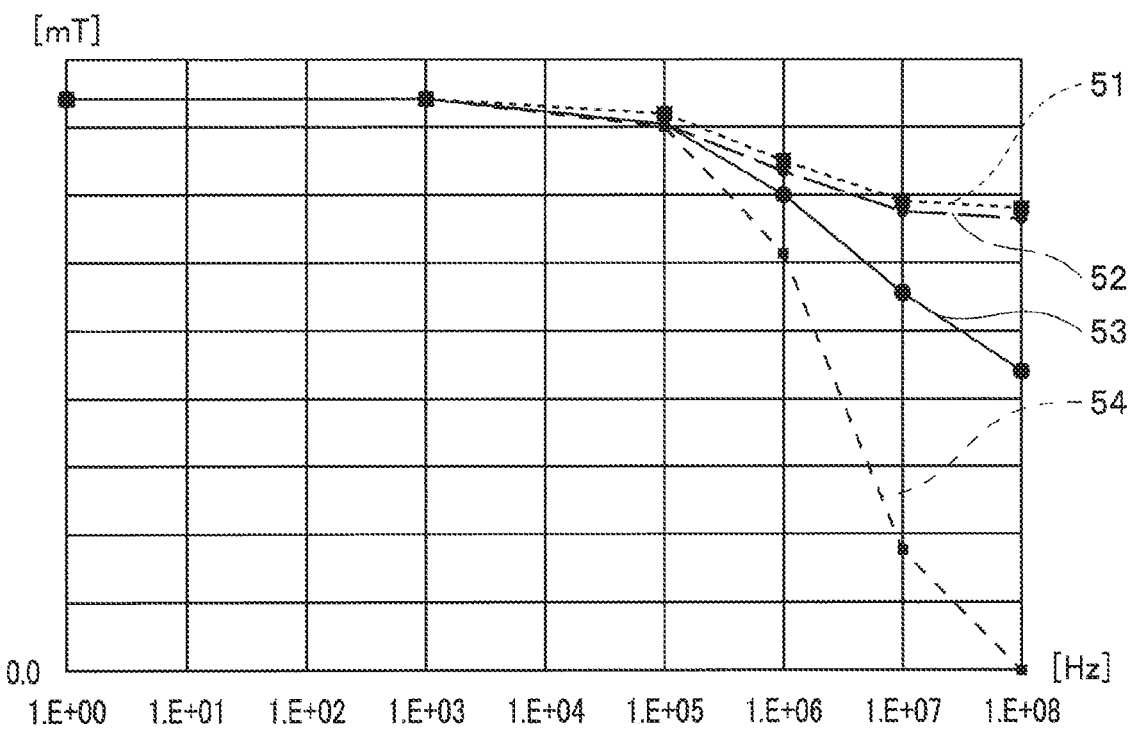

CURRENT DETECTION APPARATUS

CROSS-REFERENCE TO RELATED APPLICATION

This application is based upon and claims the benefit of priority from the prior Japanese Patent Application No. 2018-225746 filed on Nov. 30, 2018; the entire contents of which are incorporated herein by reference.

FIELD

An embodiment described herein relates generally to a current detection apparatus.

BACKGROUND

By causing a current to be detected to flow through a coil and detecting a magnetic field generated from the coil, a current detection apparatus detects the current. The generated magnetic field is detected, for example, by a hall element. A structure in which a shielding layer (a shield sheet) is provided between the coil and the hall element in order to cause the current detection apparatus to stably operate with a high performance is generally known.

In the case of the structure provided with the shielding layer, an eddy current is generated on the shielding layer, and a magnetic field in a direction opposite to the magnetic field generated from the coil is generated. Therefore, the effective magnetic field generated from the coil is cancelled by the magnetic field in the opposite direction generated by the eddy current, and the magnetic field detected by the hall element becomes insufficient. An output voltage from a driving circuit for the hall element decreases. Therefore, in a conventional current detection apparatus, the output voltage from the driving circuit for the hall element is amplified by an amplification circuit to detect a current.

However, an amplification factor of the amplification circuit is limited. Further, when the amplification factor of the amplification circuit is set too large, noise is also mixed into the driving circuit for the hall element, and there is a possibility that the performance of the current detection apparatus decreases.

BRIEF DESCRIPTION OF THE DRAWINGS

FIG. 8 is a graph showing a relationship between the frequency of the alternating current flowing through the two coil patterns $16a$ and $16b$ and the magnetic flux density of a generated magnetic field.

DETAILED DESCRIPTION

A current detection apparatus of an embodiment is provided with coil patterns, a magnetic field detection element and shielding layers. Each of the coil patterns is configured with an arc-shaped planar coil and straight line portions parallel to each other extending from an end portion of the arc-shaped planar coil. The magnetic field detection element is arranged away from the coil patterns in a direction orthogonal to planes of the planar coils and disposed to receive magnetic fields in a first direction generated by the coil patterns. Each of the shielding layers is provided between the coil pattern and the magnetic field detection element and is provided with a slit portion.

The embodiment will be described in detail below with reference to drawings.

First, a configuration of the current detection apparatus according to the present embodiment will be described based on FIGS. 1 and 2.

Figure 1:
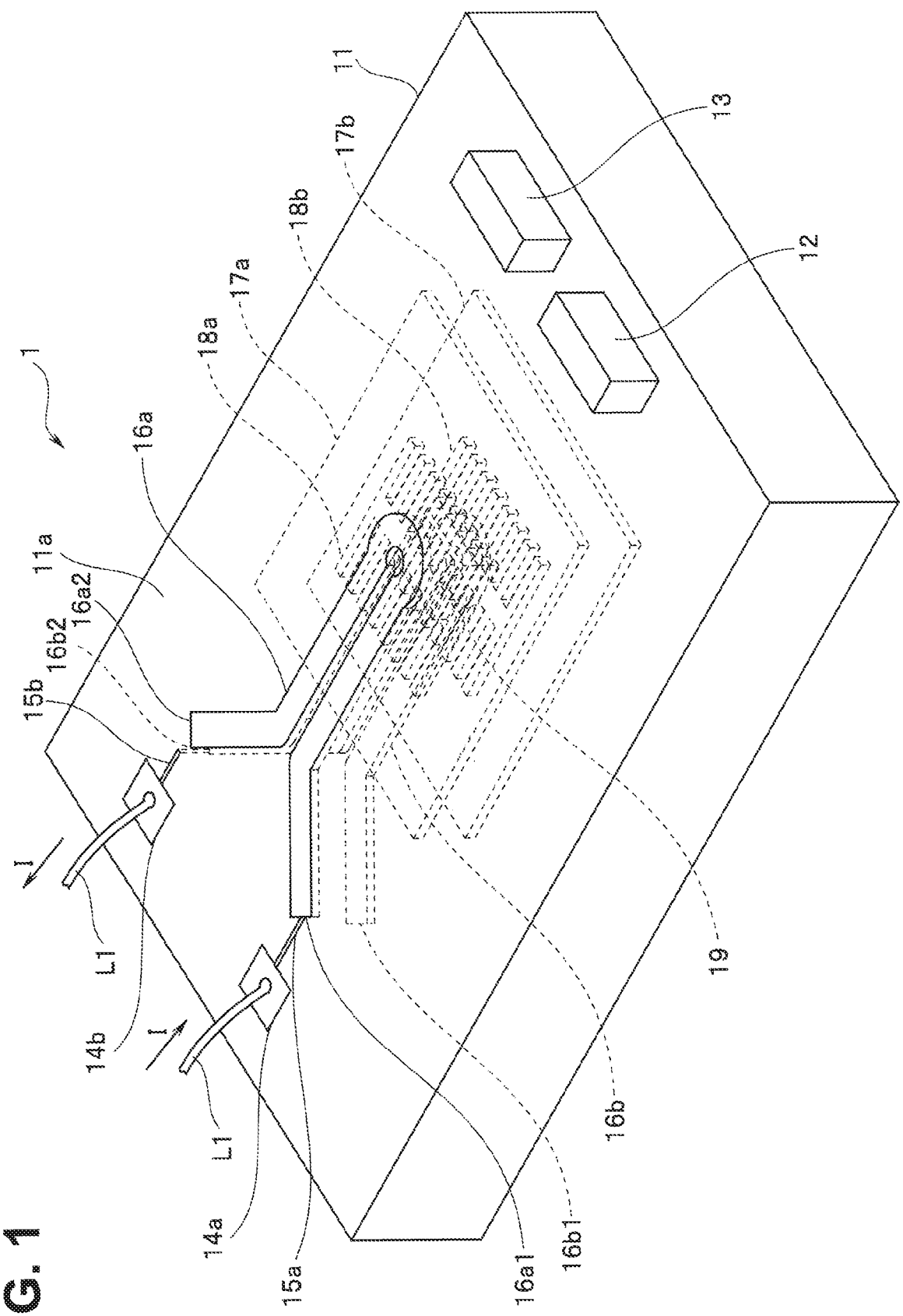
FIG. 1 is an overall configuration diagram of a current detection apparatus according to a present embodiment.
Figure 2:
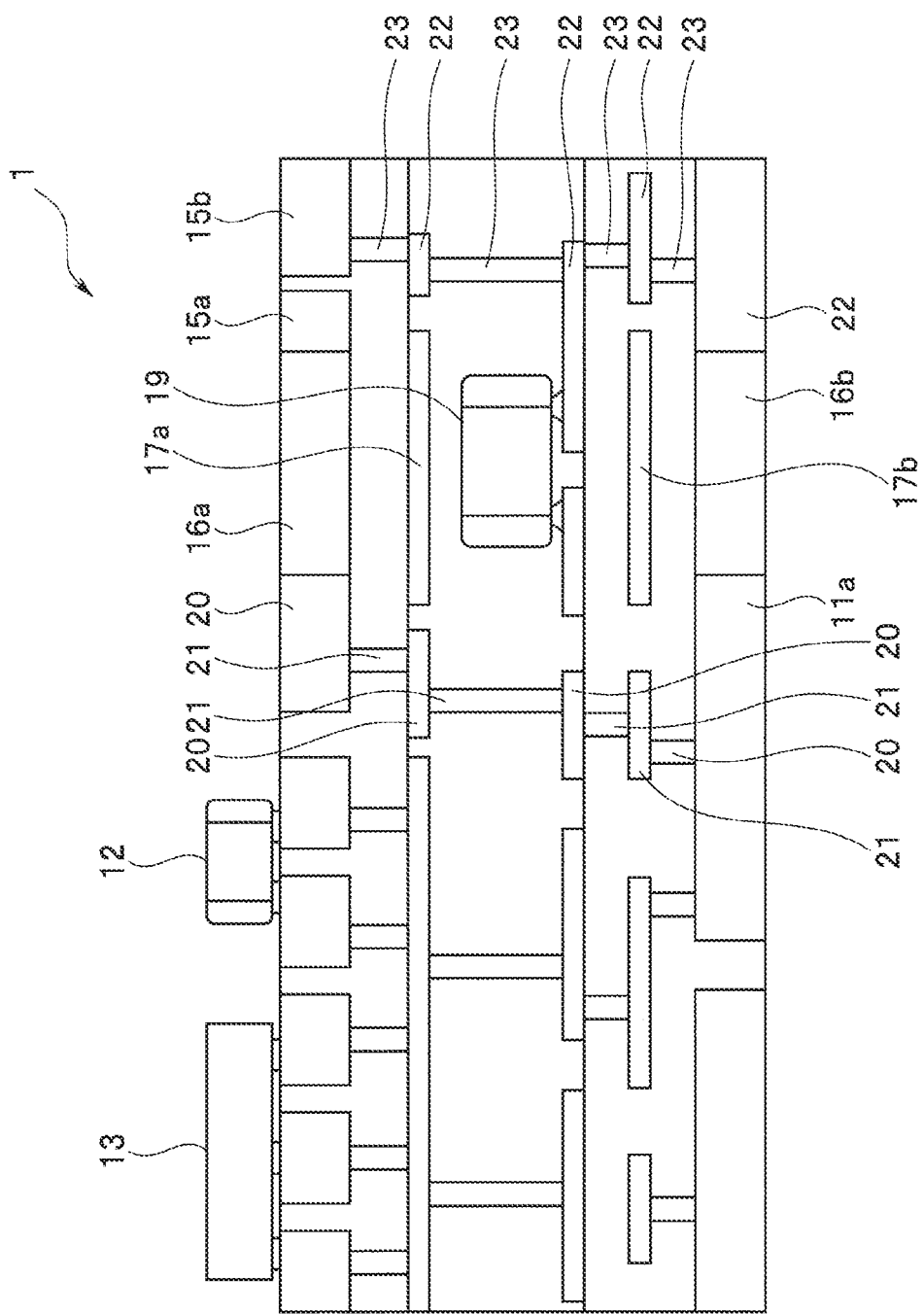
FIG. 2 is a side view of the current detection apparatus according to the present embodiment.

FIG. 1 is an overall configuration diagram of the current detection apparatus according to the present embodiment. FIG. 2 is a side view of the current detection apparatus according to the present embodiment.

A current detection apparatus 1 detects a current I flowing through wires L1. The detected current is a direct current or an alternating current. The current detection apparatus 1 is configured with one substrate 11 formed by lamination. The current detection apparatus 1 of the present embodiment is used for protection from an overcurrent and the like for an AC/DC adapter, a control device in a general-purpose inverter or motor variable speed equipment and a power module.

Note that though the current detection apparatus 1, which is the one substrate 11, is formed by lamination in the present embodiment, the current detection apparatus 1 of the present embodiment may be formed by pasting together, for example, two or more substrates.

The substrate 11 is rectangular-shaped and has a flat surface $11a$ on a front side and a flat surface $11b$ on a back side. The shape of the substrate 11 is not limited to a rectangular shape but may be in other shapes, for example, a circular shape.

On the surface $11a$, an amplification circuit 12 configured to amplify a voltage signal detected by a hall element 19 described later, and a driving circuit 13 configured to drive the hall element 19 are disposed.

On the surface $11a$, pads $14a$ and $14b$ for connecting the two wires L1, wiring patterns $15a$ and $15b$ extending from the pads $14a$ and $14b$, and a coil pattern $16a$ having an arc-shaped planar coil and straight line portions parallel to each other extending from an end portion of the arc-shaped planar coil are formed.

The coil pattern $16a$ has one end portion $16a1$ and the other end portion $16a2$, and the one end portion $16a1$ is connected to the wiring pattern $15a$. Consequently, the current I inputted from the wire L1 flows from the one end portion $16a1$ of the coil pattern $16a$ to the other end portion $16a2$.

On the surface $11b$, a coil pattern $16b$ having an arc-shaped planar coil and straight line portions parallel to each other extending from an end portion of the arc-shaped planar coil is formed. The coil pattern $16b$ has one end portion $16b1$ and the other end portion $16b2$. The one end portion $16b1$ of the coil pattern $16b$ is electrically connected to the other end portion $16a2$ of the coil pattern $16a$. The other end portion $16b2$ of the coil pattern $16b$ is electrically connected to the wiring pattern $15b$.

More specifically, the one end portion 16b1 of the coil pattern 16b is electrically connected to the other end portion 16a2 of the coil pattern 16a via a plurality of wiring patterns 20 and a plurality of conductors 21 disposed in a plurality of contact holes (that is, via holes). The other end portion 16b2 of the coil pattern 16b is electrically connected to the wiring pattern 15b via a plurality of wiring patterns 22 and a plurality of conductors 23 disposed in a plurality of contact holes.

Consequently, the current I inputted from the other end portion 16a2 of the coil pattern 16a flows from the one end portion 16b1 of the coil pattern 16b to the other end portion 16b2. As a result, a direction of a magnetic field generated by the coil pattern 16a and a direction of a magnetic field generated by the coil pattern 16b are the same. In description below, the direction of the magnetic fields generated by the coil patterns 16a and 16b will be referred to as the first direction.

Between the coil pattern 16a and the hall element 19, a shielding layer 17a for shielding entrance of electromagnetic noise into the hall element 19 or the driving circuit for the hall element 19 is provided. Similarly, between the coil pattern 16b and the hall element 19, a shielding layer 17b for shielding entrance of electromagnetic noise into the hall element 19 or the driving circuit for the hall element 19 is provided. The shielding layers 17a and 17b are sheet members made of electrical conducting material such as copper or aluminum.

The shielding layers 17a and 17b are provided with slit portions 18a and 18b, respectively. When magnetic fields in the first direction are generated by the coil patterns 16a and 16b, eddy currents are generated on the shielding layers 17a and 17b. Magnetic fields in a second direction opposite to the magnetic fields in the first direction are generated by the eddy currents generated on the shielding layers 17a and 17b. The slit portions 18a and 18b provided on the shielding layers 17a and 17b have a function for reducing the magnetic fields in the second direction generated by the eddy currents.

The hall element 19 as a magnetic sensor is disposed in the substrate 11. The hall element 19 is arranged to be located between the two coil patterns 16a and 16b. More specifically, the hall element 19 is arranged to be located between the shielding layers 17a and 17b. The hall element 19, which is a magnetic field detection element, generates electromotive force proportional to a magnetic field density and outputs a voltage signal corresponding to the electromotive force.

In other words, each of the two coil patterns 16a and 16b has the arc-shaped planar coil and the straight line portions parallel to each other extending from the end portion of the arc-shaped planar coil. The hall element 19 is arranged away from each of the coil patterns 16a and 16b in a direction orthogonal to planes of the two coil patterns 16a and 16b and disposed to receive a magnetic field formed by each of the coil patterns 16a and 16b when a current flows through the two coil patterns 16a and 16b.

More specifically, a central axis of a magnetic flux generated by the coil pattern 16a and a central axis of a magnetic flux generated by the coil pattern 16b are located on a same axis, and the hall element 19 is disposed on the same axis between the coil patterns 16a and 16b.

An output signal (a voltage signal) of the hall element 19 is inputted to the amplification circuit 12 arranged on the substrate 11 via a plurality of wiring patterns provided on and in the substrate 11 and a plurality of conductors arranged in a plurality of contact holes, and amplified. The hall element 19 outputs the voltage signal by detecting a magnetic flux generated by the current I inputted to the coil patterns 16a and 16b, but an amplitude of a voltage is small. Therefore, the current I inputted to the coil patterns 16a and 16b is observed by amplifying the voltage by the amplification circuit 12.

(Configuration of Coil Pattern and Shielding Layer)

Figure 3:
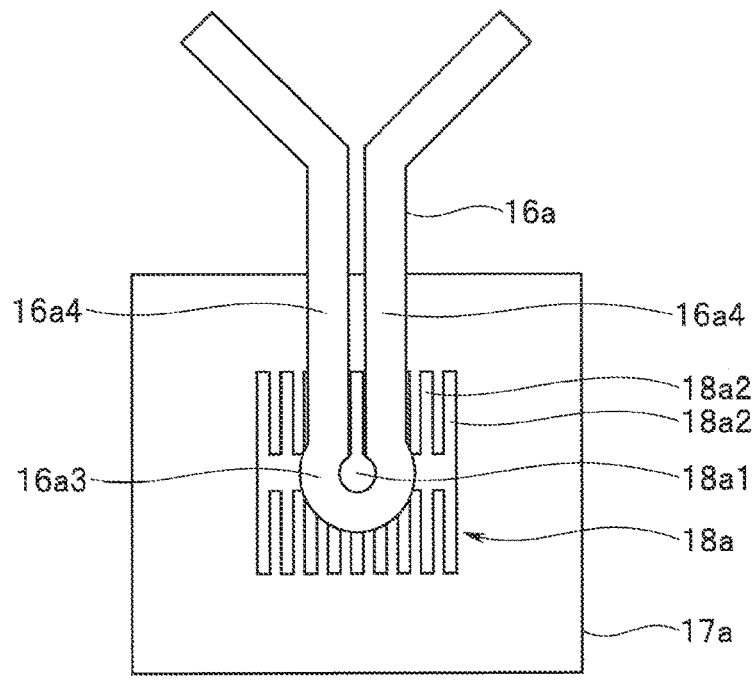
FIG. 3 is a front view for illustrating arrangement of a coil pattern and a shielding layer.

FIG. 3 is a front view for illustrating configurations of a coil pattern and a shielding layer. Note that though configurations of the coil pattern 16a and the shielding layer 17a are described with reference to FIG. 3, configurations of the coil pattern 16b and the shielding layer 17b are similar to the configurations of the coil pattern 16a and the shielding layer 17a, respectively.

As shown in FIG. 3, the coil pattern 16a is configured with an arc-shaped planar coil 16a3 having a hole in a center, and straight line portions 16a4 parallel to each other extending from an end portion of the arc-shaped planar coil 16a3.

The shielding layer 17a is provided with the slit portion 8a for reducing a magnetic field in the second direction generated by an eddy current. The slit portion 18a is configured having a rectangular-shaped opening portion 18a1 provided in a manner of including (passing through) a center hole of the arc-shaped planar coil 16a3 when the coil pattern 16a is viewed in plan, and at least two or more slits 18a2 extending from the opening portion 18a1. The at least two or more slits 18a2 extend symmetrically in a vertical direction of the rectangular-shaped opening portion 18a1.

Figure 4:
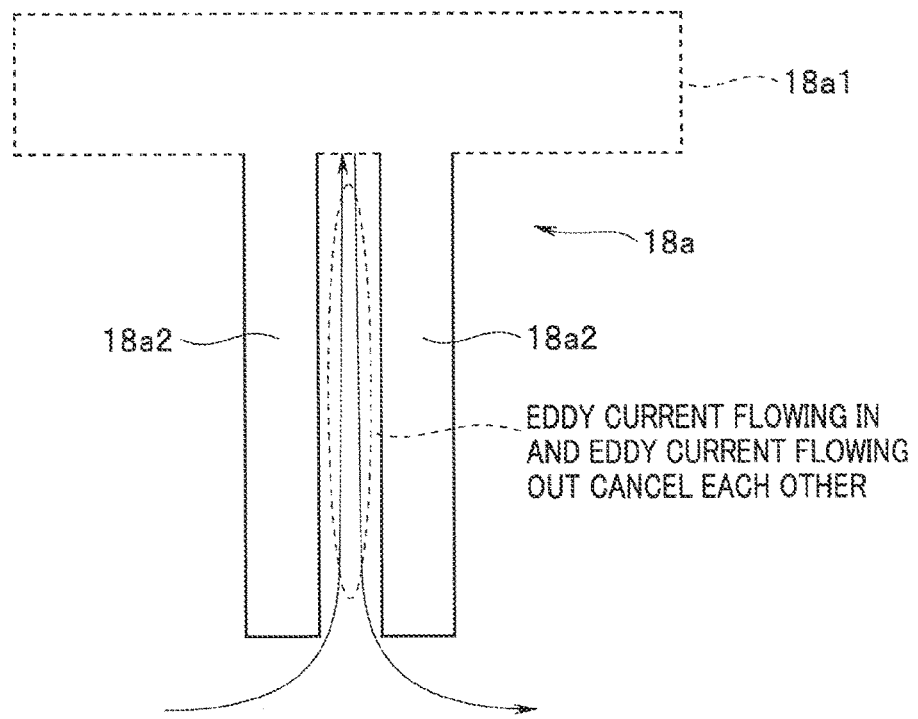
FIG. 4 is a diagram for illustrating an example of an eddy current generated on the shielding layer.

FIG. 4 is a diagram for illustrating an example of an eddy current generated on the shield layer.

An eddy current generated on the shielding layer 17a flows into between the two slits 18a2 of the slit portion 18a and reflected by an edge of the opening portion 18a1. At the time, since the eddy current flowing into between the two slits 18a2 and the eddy current flowing from between the two slits 18a2 cancel each other, a magnetic field in the second direction generated by the eddy current is reduced. Especially, since the eddy current flowing into between the two slits 18a2 and the eddy current flowing from between the two slits 18a2 are parallel to each other, a cancellation effect increases.

In the present embodiment, each of the slits 18a2 of the slit portion 18a is in a rectangular shape. In the case, since a direction of the eddy current flowing into between the two slits 18a2 and a direction of the eddy current flowing from between the two slits 18a2 are completely opposite directions (180°), the cancellation effect is the largest.

Note that the shape of each slit 18a2 of the slit portion 18a is not limited to a rectangular shape but may be another shape. In the case, though there may be a case where the direction of the eddy current flowing into between the two slits 18a2 and the direction of the eddy current flowing from between the two slits 18a2 are not completely opposite directions (180°), the effect of canceling the eddy current that flows in and the eddy current that flows out is sufficient.

The magnetic field in the second direction generated by the eddy current and the magnetic field in the first direction generated by the coil pattern 16a are in opposite directions. Therefore, the magnetic field in the first direction generated by the coil pattern 16a to be detected by the hall element 19 is cancelled by the magnetic field in the second direction generated by the eddy current and reduced.

In the present embodiment, the magnetic field in the second direction generated by the eddy current can be reduced by the slit portion 18a provided on the shielding layer 17a. Therefore, a cancellation effect between the magnetic field in the first direction generated by the coil pattern 16*a* and the magnetic field in the second direction generated by the eddy current, which is opposite to the magnetic field in the first direction generated by the coil pattern 16*a*, is reduced. As a result, the current detection apparatus 1 can increase a magnetic field that can be detected by the hall element 19.

Similarly, a magnetic field in the second direction generated by an eddy current can also be reduced by the slit portion 18*b* on the shielding layer 17*b*. Consequently, the cancellation effect between the magnetic field in the first direction generated by the coil pattern 16*b* and the magnetic field in the second direction generated by the eddy current is reduced, and the magnetic field that can be detected by the hall element 19 can be increased.

Figure 5:
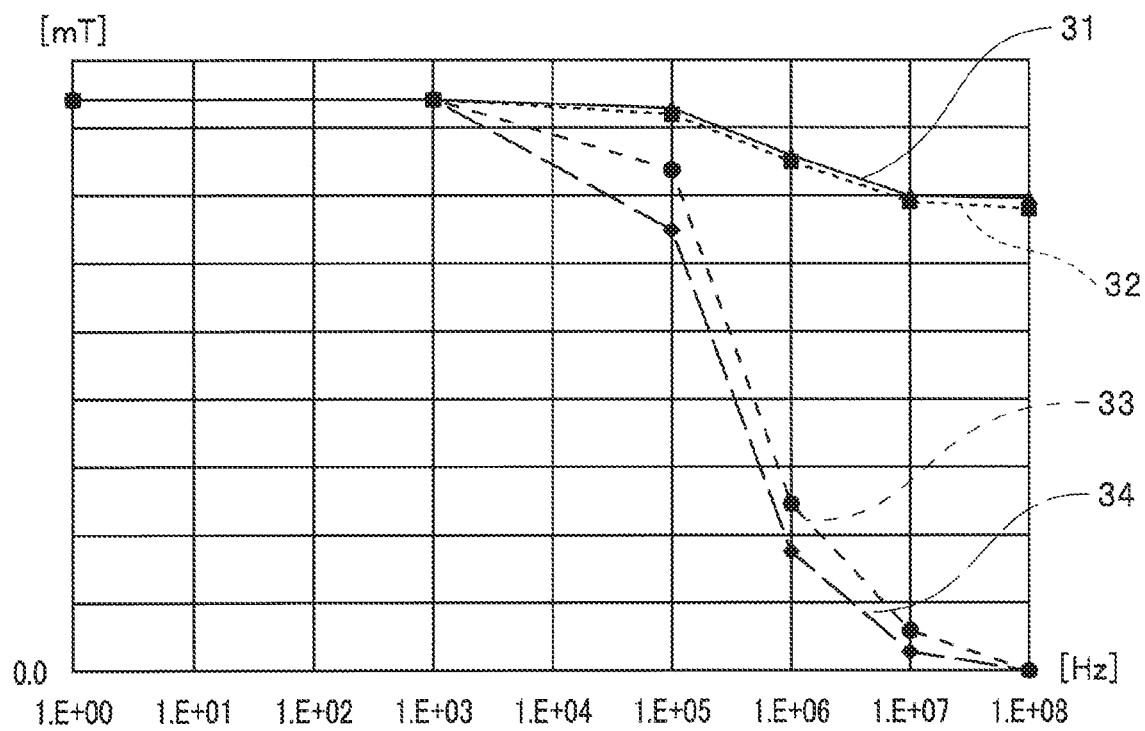
FIG. 5 is a graph showing a relationship between a frequency of an alternating current flowing through two coil patterns $16a$ and $16b$ and a magnetic flux density of a generated magnetic field.

FIG. 5 is a graph showing a relationship between a frequency of an alternating current flowing through the two coil patterns 16*a* and 16*b* and a magnetic flux density of a generated magnetic field. FIG. 5 shows changes in the magnetic flux density caused according to material of the shielding layers 17*a* and 17*b* and presence/absence of the slit portions 18*a* and 18*b*.

A line graph 31 shows changes in the magnetic flux density caused when the material of the shielding layers 17*a* and 17*b* is aluminum, and the slit portions 18*a* and 18*b* are provided. A line graph 32 shows changes in the magnetic flux density caused when the material of the shielding layers 17*a* and 17*b* is copper, and the slit portions 18*a* and 18*b* are provided.

A line graph 33 shows changes in the magnetic flux density caused when the material of the shielding layers 17*a* and 17*b* is aluminum, and neither the slit portion 18*a* nor 18*b* is provided. A line graph 34 shows changes in the magnetic flux density caused when the material of the shielding layers 17*a* and 17*b* is copper, and neither the slit portion 18*a* nor 18*b* is provided.

As shown in FIG. 5, when the frequency of the current to be detected is low, the magnetic flux density generated by the two coil patterns 16*a* and 16*b* does not change by the material of the shielding layers 17*a* and 17*b* or presence/absence of the slit portions 18*a* and 18*b*.

However, when the frequency of the current to be detected increases, the magnetic flux density generated by the two coil patterns 16*a* and 16*b* significantly differs according to whether the slit portions 18*a* and 18*b* are provided or not. For example, when the frequency is 1M (1·E+06) Hz or above, the magnetic flux density significantly differs according to whether the slit portions 18*a* and 18*b* are provided or not.

More specifically, in the case where the material of the shielding layers 17*a* and 17*b* is aluminum, and the slit portions 18*a* and 18*b* are provided (the line graph 31), the magnetic flux density is higher by more than two times in comparison with the case where the material of the shielding layers 17*a* and 17*b* is aluminum, and neither the slit portion 18*a* nor 18*b* is provided (the line graph 33).

Thus, by providing the shielding layers 17*a* and 17*b* with the slit portions 18*a* and 18*b*, it is possible to reduce the magnetic fields in the second direction generated by the eddy currents. The magnetic field in the second direction generated by the eddy current is opposite to the magnetic field in the first direction generated by the arc-shaped planar coil 16*a*3.

Further, the magnetic field in the second direction generated by the eddy current weakens the magnetic field in the first direction generated by the arc-shaped planar coil 16*a*3. In the present embodiment, since the magnetic field in the second direction generated by the eddy current can be reduced, the effect of canceling the magnetic field in the first direction is reduced, and it is possible to detect a high magnetic field by the hall element 19.

Therefore, according to the current detection apparatus of the embodiment described above, it is possible to increase a magnetic field detected by a hall element.

Since a role of the shielding layers 17*a* and 17*b* of the present embodiment is to shield entrance of electromagnetic noise into the hall element 19 or the driving circuit for the hall element 19, it is not possible to completely remove the shielding layers 17*a* and 17*b* from the current detection apparatus 1 or provide large openings in the shielding layers 17*a* and 17*b* near the hall element 19. However, if the shielding layers 17*a* and 17*b* are provided between the coil pattern 16*a* and the hall element 19 and between the coil pattern 16*b* and the hall element 19, a magnetic flux detected by the hall element 19 is reduced.

In comparison, in the current detection apparatus 1 of the present embodiment, by providing the shielding layers 17*a* and 17*b* with the slit portions 18*a* and 18*b* described above, it is possible to shield entrance of electromagnetic noise into the hall element 19 or the driving circuit for the hall element 19, and it is possible to increase the magnetic flux detected by the hall element 19 as shown in FIG. 5. In other words, the current detection apparatus 1 of the present embodiment can enable both of reduction in electromagnetic noise that enters the hall element 19 or the driving circuit for the hall element 19 and an effect of causing the magnetic flux detected by the hall element 19 to be increased.

Note that though each of the two coil patterns 16*a* and 16*b* is configured with the arc-shaped planar coil having the hole in the center and the straight line portions parallel to each other extending from the end portion of the arc-shaped planar coil, the shape of the two coil patterns 16*a* and 16*b* is not limited to the above shape. For example, the arc-shaped planar coil of each of the two coil patterns 16*a* and 16*b* may be a spiral-shaped planar coil with a plurality of turns. Further, the arc-shaped planar coil of each of the two coil patterns 16*a* and 16*b* may be a square-shaped planar coil or a triangular-shaped planar coil. Furthermore, though the straight line portions extending from the end portion of the arc-shaped planar coil of each of the two coil patterns 16*a* and 16*b* are parallel to each other, the straight line portions are not limited to the state but may not be parallel to each other.

Though the two coil patterns 16*a* and 16*b* are provided in a manner of sandwiching the hall element 19 in the embodiment described above, the number of coil patterns may be one. Furthermore, though the two shielding layers 17*a* and 17*b* are provided in a manner of sandwiching the hall element 19 in the embodiment described above, the number of shielding layers may be one. For example, when one coil pattern and one shielding layer are provided in the current detection apparatus 1, it is only required to arrange the one shielding layer between the one coil pattern and the hall element 19.

(Modification 1)

Figure 6:
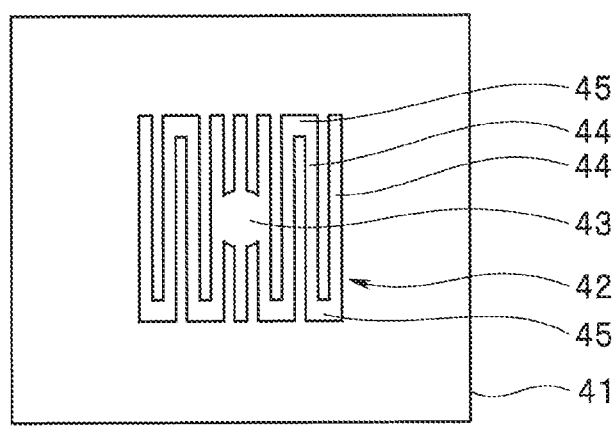
FIG. 6 is a diagram for illustrating another configuration of a slit portion.
Figure 7:
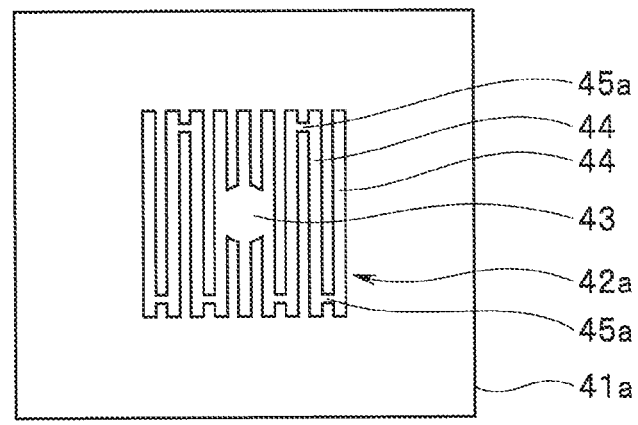
FIG. 7 is a diagram for illustrating another configuration of the slit portion.

Note that though the slit portion 18*a* is configured having the rectangular-shaped opening portion 18*a*1 and the at least two or more slits 18*a*2 extending symmetrically in the vertical direction of the opening portion 18*a*1 in the embodiment described above, the slit portion 18*a* is not limited to the above but may have a configuration shown in FIG. 6 or 7.

FIG. 6 is a diagram for illustrating another configuration of the slit portion. A shielding layer 41 shown in FIG. 6 is provided with a slit portion 42 for reducing a magnetic field in the second direction generated by an eddy current similarly to the embodiment described above.

The slit portion 42 is configured having a circular-shaped opening portion 43 provided in a manner of including (passing through) a center hole of the arc-shaped planar coil 16a3 when the coil pattern 16a is viewed in plan, and at least two or more slits 44. Furthermore, the slit portion 42 is configured having one or more coupling portions 45 each of which is configured to couple adjoining end portions of adjoining slits 44 among the at least two or more slits 44.

FIG. 7 is a diagram for illustrating another configuration of the slit portion. Note that, in FIG. 7, components similar to components in FIG. 6 are given the same reference symbols, and description of the components will be omitted. A shielding layer 41a shown in FIG. 7 is provided with a slit portion 42a for reducing a magnetic field in the second direction generated by an eddy current, similarly to the embodiment described above. The slit portion 42a is configured having one or more coupling portions 45a each of which is configured to couple adjoining slits 44 among the at least two or more slits 44 at a predetermined position.

(Modification 2)

Changes in the magnetic flux density caused according to the material of the shielding layers 17a and 17b and presence/absence of the slit portions 18a and 18b have been described in FIG. 5 of the embodiment described above. In a modification 2, changes in the magnetic flux density caused according to a thickness of the shielding layers 17a and 17b and presence/absence of the slit portions 18a and 18b will be described.

FIG. 8 is a graph showing a relationship between the frequency of the alternating current flowing through the two coil patterns 16a and 16b and the magnetic flux density of a generated magnetic field. FIG. 8 shows changes in the magnetic flux density caused according to the thickness of the shielding layers 17a and 17b and presence/absence of the slit portions 18a and 18b. Note that the material of the shielding layers 17a and 17b is aluminum.

A line graph 51 shows changes in the magnetic flux density caused when the thickness of the shielding layers 17a and 17b is 5 um, and the slit portions 18a and 18b are provided. A line graph 52 shows changes in the magnetic flux density caused when the thickness of the shielding layers 17a and 17b is 11 um, and the slit portions 18a and 18b are provided.

A line graph 53 shows changes in the magnetic flux density caused when the thickness of the shielding layers 17a and 17b is 5 um, and neither the slit portion 18a nor 18b is provided. A line graph 54 shows changes in the magnetic flux density caused when the thickness of the shielding layers 17a and 17b is 11 um, and neither the slit portion 18a nor 18b is provided.

As shown in FIG. 8, when the frequency of the current to be detected is low, the magnetic flux density generated by the two coil patterns 16a and 16b does not change by the thickness of the shielding layers 17a and 17b or presence/absence of the slit portions 18a and 18b.

However, when the frequency of the current to be detected increases, the magnetic flux density generated by the two coil patterns 16a and 16b significantly differs according to whether the slit portions 18a and 18b are provided or not. For example, when the frequency is 1M (1·E+06) Hz or above, the magnetic flux density significantly differs according to whether the slit portions 18a and 18b are provided or not.

Furthermore, when neither the slit portion 18a nor 18b is provided, the magnetic flux density significantly differs according to the thickness of the shielding layers 17a and 17b. In other words, the magnetic flux density generated by the two coil patterns 16a and 16b significantly decreases as the thickness of the shielding layers 17a and 17b increases, as shown by the line graphs 53 and 54 in FIG. 8.

On the other hand, when the slit portions 18a and 18b are provided, dependence of the magnetic flux density on the thickness of the shielding layers 17a and 17b is low. In other words, the magnetic flux density generated by the two coil patterns 16a and 16b does not significantly decrease even if the thickness of the shielding layers 17a and 17b increases, as shown by the line graphs 51 and 52 in FIG. 8.

Thus, by providing the shielding layers 17a and 17b with the slit portions 18a and 18b, it is possible to detect a high magnetic field by the hall element 19 without depending on the thickness of the shielding layers 17a and 17b.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A current detection apparatus comprising:
   a coil pattern configured with an arc-shaped planar coil and straight line portions parallel to each other extending from an end portion of the arc-shaped planar coil;
   a magnetic field detection element arranged away from the coil pattern in a direction orthogonal to a plane of the planar coil and disposed to receive a magnetic field in a first direction generated by the coil pattern; and
   a shielding layer provided between the coil pattern and the magnetic field detection element and comprising a slit portion,
   wherein the slit portion includes an opening portion including a hole provided in a center of the planar coil when the coil pattern is viewed in plan, and at least two or more slits extending from the opening portion.

2. The current detection apparatus according to claim 1, wherein the slit portion includes a coupling portion configured to couple adjoining end portions of adjoining slits among the at least two or more slits.

3. The current detection apparatus according to claim 1, wherein the slit portion includes a coupling portion configured to couple adjoining slits among the at least two or more slits at a predetermined position.

4. The current detection apparatus according to claim 1, wherein the shielding layer shields electromagnetic noise that enters the magnetic field detection element or a driving circuit for the magnetic field detection element.

5. The current detection apparatus according to claim 1, comprising:
   an amplification circuit configured to amplify a voltage signal detected by the magnetic field detection element; and
   a driving circuit configured to drive the magnetic field detection element.

6. A current detection apparatus comprising:
- a coil pattern configured with an arc-shaped planar coil and straight line portions parallel to each other extending from an end portion of the arc-shaped planar coil;
- a magnetic field detection element arranged away from the coil pattern in a direction orthogonal to a plane of the planar coil and disposed to receive a magnetic field in a first direction generated by the coil pattern; and
- a shielding layer provided between the coil pattern and the magnetic field detection element and comprising a slit portion,
- wherein the coil pattern includes first and second coil patterns, a central axis of a magnetic flux generated by the first coil pattern and a central axis of a magnetic flux generated by the second coil pattern are located on a same axis, and
- the magnetic field detection element is disposed on the same axis between the first and second coil patterns.

\* \* \* \* \*